United States Patent
Joshi et al.

(10) Patent No.: US 7,380,225 B2
(45) Date of Patent: May 27, 2008

(54) METHOD AND COMPUTER PROGRAM FOR EFFICIENT CELL FAILURE RATE ESTIMATION IN CELL ARRAYS

(75) Inventors: Rajiv V. Joshi, Yorktown Heights, NY (US); Rouwaida N. Kanj, Round Rock, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/375,477

(22) Filed: Mar. 14, 2006

(65) Prior Publication Data

US 2007/0220455 A1    Sep. 20, 2007

(51) Int. Cl.
 *G06F 17/50* (2006.01)
(52) U.S. Cl. ........................ 716/4; 716/5; 716/17; 703/2
(58) Field of Classification Search .................... 716/4, 716/14, 5; 700/121; 703/14, 2, 13
See application file for complete search history.

(56) References Cited

U.S. PATENT DOCUMENTS

| | | | | |
|---|---|---|---|---|
| 2002/0059012 | A1* | 5/2002 | Ogawa et al. | 700/121 |
| 2004/0268275 | A1* | 12/2004 | Cappelletti et al. | 716/4 |
| 2005/0273308 | A1* | 12/2005 | Houston | 703/14 |
| 2006/0142988 | A1* | 6/2006 | Akiyama et al. | 703/14 |
| 2006/0150129 | A1* | 7/2006 | Chiu et al. | 716/4 |
| 2007/0044049 | A1* | 2/2007 | Adams et al. | 716/4 |

OTHER PUBLICATIONS

U.S. Appl. No. 11/077,313, Joshi et al.
Mukhopadhyay, et al., "Statistical Design and Optimization of SRAM Cell for Yield Enhancement", ICCAD Proceedings 2004, pp. 10-13, IEEE, New York, NY.

* cited by examiner

*Primary Examiner*—Paul Dinh
*Assistant Examiner*—Nha Nguyen
(74) *Attorney, Agent, or Firm*—Mitch Harris, Atty at Law, LLC; Andrew M. Harris; Casimer K. Salys

(57) ABSTRACT

A method and computer program for efficient cell failure rate estimation in cell arrays provides an efficient mechanism for raising the performance of memory arrays beyond present levels/yields. An initial search is performed across cell circuit parameters to determine failures with respect to a set of performance variables. For a single failure region the initial search can be a uniform sampling of the parameter space and when enough failure points have been accumulated, a mean is chosen from the mean of the detected failure points. Mixture importance sampling (MIS) is then performed to efficiently estimate the single failure region. For multiple failure regions, a particular failure region is selected by varying the memory circuit cell parameters along a random set of vectors until failures are detected, thus identifying the boundary of the failure region of interest as the closest failure region. A new mean is chosen for MIS in conformity with the location of the detected boundary.

9 Claims, 6 Drawing Sheets

METHOD AND COMPUTER PROGRAM FOR EFFICIENT CELL FAILURE RATE ESTIMATION IN CELL ARRAYS

CROSS-REFERENCE TO RELATED APPLICATIONS

The present application is related to U.S. patent application Ser. No. 11/077,313, entitled "EFFICIENT METHOD AND COMPUTER PROGRAM FOR MODELING AND IMPROVING STATIC MEMORY PERFORMANCE ACROSS PROCESS VARIATIONS AND ENVIRONMENTAL CONDITIONS", filed on Mar. 10, 2004, having at least one common inventor and assigned to the same Assignee. The specification of the above-referenced Patent Application is incorporated herein by reference.

BACKGROUND OF THE INVENTION

1. Technical Field

The present invention relates generally to memory circuit design methodologies and programs for designing digital memory circuits, and more particularly to a method and computer program for estimating cell failure rates in cell arrays.

2. Description of the Related Art

As memory array architectures are pushed to their practical limits by increasing requirements for density and speed, accurately estimating the cell failure rate of a design becomes increasingly critical. Since a finite number of redundant rows and/or columns is available to replace those containing defective cells, a number of failed cells above this level of redundancy will yield a defective device. The number of defective devices, or device yield is then directly related to the cell failure rate. The larger arrays being fabricated today have increasingly stringent failure rate control requirements. For example, in order to achieve a yield of 90% in a one-million cell array without redundancy, a failure rate below $5\sigma$ must be held.

Traditional techniques such as Monte-Carlo analysis produce accurate results at a cost of a large number of iterations, due to the random sampling of the entire probability space of the independent variables that are treated in the analysis. As the cell failure rate decreases, the number of samples and iterations required for accurate analysis becomes increasingly large, because of the relatively sparse distribution of samples in the distribution tail(s) that correspond to failed cells. The effect of circuit changes on cell read and write-ability, as well as minimum read and write cycle times and margins are difficult to estimate at very low failure rate levels, so such low failure rates cause further complications for adjusting designs to achieve the best result.

Techniques other than Monte-Carlo analysis have been implemented for estimating cell failure rates, each with related drawbacks. Sensitivity analysis is a well-known technique in which the gradients of the various independent variables are used to determine the bounds of the non-failure confidence region. However, accurate estimates of the failure rate are not typically produced by sensitivity analysis, as sensitivity analysis by its very nature cannot determine the exact overlapping impact of all independent variables on the cell failure rate at once. Another technique that can accurately estimate the failure rate is the grid analysis approach, in which the grid size can be made arbitrarily small. However, the number of simulations increases exponentially with the number of independent variables and typically a large amount of custom coded program control (scripting) must be employed to direct the analysis.

It is therefore desirable to provide a method for accurately and efficiently determining cell failure rates under extremely low failure rate conditions.

SUMMARY OF THE INVENTION

The objective of accurately and efficiently determining array cell failure rates under extremely low failure rate conditions is achieved by a statistical analysis method.

The method may be embodied in program instructions executing within a workstation computer, and also in a computer program product comprising media for storing the program instructions for execution within a workstation computer system.

An initial search is used in the design parameter variable space in order to gather information about one or more failure regions. A failure region of interest is identified from the initial search result and a new distribution center is chosen for further analysis using mixture importance sampling (MIS) of the region of interest.

The region of interest may be a single failure mode region, and the new center may be determined as the center of gravity of cell failures from a uniform sampling performed for the initial search, so that further analysis is focused on the single failure mode region. Alternatively, the location of groups of samples from the uniform sampling can be observed and if multiple regions are present, either a dominant region of interest can be selected for further analysis using MIS, or multiple regions can be studied either independently or via an MIS distribution with multiple regions of interest.

Alternatively, in circuits where multiple failure modes (and thus multiple failure regions) are present, the boundary of the failure region of interest can be determined by finding the closest failures to the (non-failing) nominal design parameters and performing the initial search by generating random vector directions around the nominal values. The variation is progressively increased along the vectors away from the nominal values until failures are detected corresponding to a failure region boundary. Then, the mixture importance sampling is performed around a new mean determined in conformity with the detected boundary, which may be a mean position of the boundary points, or an estimated point within the region determined from the location of the boundary.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
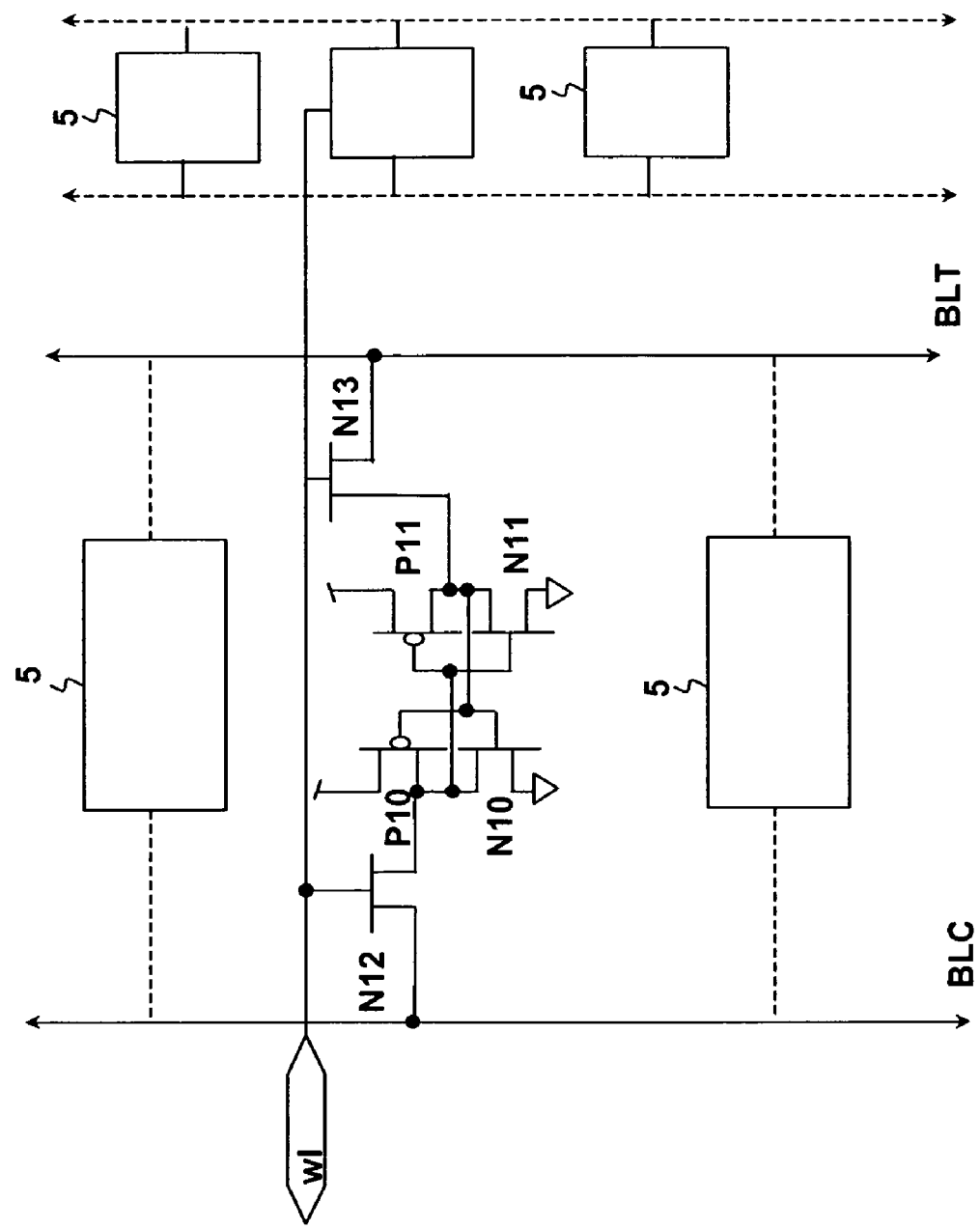
FIG. 1 is a schematic diagram of a memory cell within an array of memory cells that can be modeled in accordance with an embodiment of the invention.

The present invention concerns techniques for overcoming the limitations of traditional Monte-Carlo analysis for circuits where the failure rate of the circuit being analyzed is very low. In particular, with respect to circuits having large arrays of identical cells, the cells are generally the determining factor in the failure rate, but only as a totality of the cells. Since millions of cells may be incorporated in a memory array, even very low failure rates contribute significantly to the failure rate of the individual memory devices or other devices that incorporate memory such arrays.

Therefore, it is necessary to analyze the cell design and process variations at the extreme end of the distribution of actual cell parameters in order to gain meaningful information that can accurately predict device yields and permit improvement of the cells in order to improve device yields. The techniques presently used either require exhaustive computation and storage, or do not perform well once there are more than a small number of variable design and process parameters, such as device areas or lengths and widths, doping densities, threshold voltages and other measures of design and process parameters. The present invention provides a mechanism for using mixture importance sampling (MIS), which is a known technique, in a manner that effectively models memory cells.

MIS uses a mixture of two or more distributions for generating sample values, with at least one of the distributions biased to generate samples in a region of interest. In the present invention the sample values are input vectors of design and process-dependent electrical circuit parameters that determine the performance of the memory cell. The performance is measured in terms of operational performance values such as read and write delay time, writability (i.e., can the cell value be changed during a write) and read stability (i.e., will the cell hold its value during reads), as well as the margins associated with the read and write times, under the operational and circuit parametric conditions simulated. Since a priori knowledge about what regions in N-space might be of interest is not generally easily obtained (where N is the number of variable parameters), the present invention provides a front-end mechanism to the MIS analysis that identifies and quantifies a particular region or regions of interest for further study via the MIS technique. The result is that the computational overhead and storage associated with the analysis is greatly reduced, while yielding the desired accuracy with respect to the failure mechanism(s) being studied.

In order to locate a region of interest that provides information about a particular failure mechanism, a priori information about the failure mechanisms to expect is useful. If it is known that a single dominant failure mode is present, such as in many SRAM cell designs, then the identification of the region of interest is simplified. If it is known that multiple regions of interest having statistically significant impact will be present, then the analysis can proceed until all regions of interest are identified. If it is not known how many failure mechanisms will be of interest and/or significant within the probability space to be explored, then techniques must be employed that can handle either the single-region or multiple region cases.

In the multiple region case, there are also two alternatives for applying the MIS technique. Either the regions of interest can be studied independently, or the sampling function for the MIS technique can include multiple sampling centers concentrated on the approximate centers of the multiple regions. The latter technique can be used to avoid error in failure rate prediction due to overlap of the regions of interest in one or more dimensions.

With reference now to the figures, and in particular with reference to FIG. 1, an exemplary memory cell that can be modeled by a method in accordance with an embodiment of the invention is shown in an array that includes other cells 5. Transistors P10, N10, P11 and N11 form a cross-coupled static latch that provides the storage of a value in the cell. Transistors N12 and N13 provide for access to the value in response to a wordline select signal WL. Bitlines BLT (true bitline) and BLC (complement bitline) couple all cells in a column, so that when a row is selected by signal WL, only one row cell from each column is exposed to the memory logic. For a write operation, bitlines BLC and BLT are charged to voltages corresponding to the desired state of the memory cell and WL is activated (pulsed), setting the state of the latch formed by transistors P10, N10, P11 and N11. For a read operation, the bitlines BLC and BLT are previously charged to opposite state predetermined voltages (generally $V_{dd}$ and ground), and to commence the read, WL is pulsed and a sense amplifier coupled to bitlines BLC and BLT determines the stored state by differential comparison of bitlines BLC and BLT. Depending on the relative strengths of the transistors P10-11 and N10-13, the cell will exhibit varying ability to perform to predetermined read/write cycle times and may be unstable in that the cell value does not remain constant after a write or when being read. As operating frequencies are increased and device sizes correspondingly decreased, the variations take on a statistically significantly greater range causing failure of an increasing number of devices in a lot. The present invention is directed toward an efficient method for statistically analyzing the design of memory cells so that the yield of memory cells can be predicted accurately and further so that yields may be improved by selecting optimized nominal values for the device parameters and other environmental parameters such as operating voltages.

While the illustrated cell is an example of a cell of order 4 that may be analyzed and improved by a method according to an embodiment of the invention, it should be understood that the techniques illustrated herein may be applied to memory cells of any order and design and to circuits other than memory circuits, as well. (Order as used herein refers to the number of devices that implement the storage element of the cell exclusive of the bitline access transistors.)

Figure 2A:
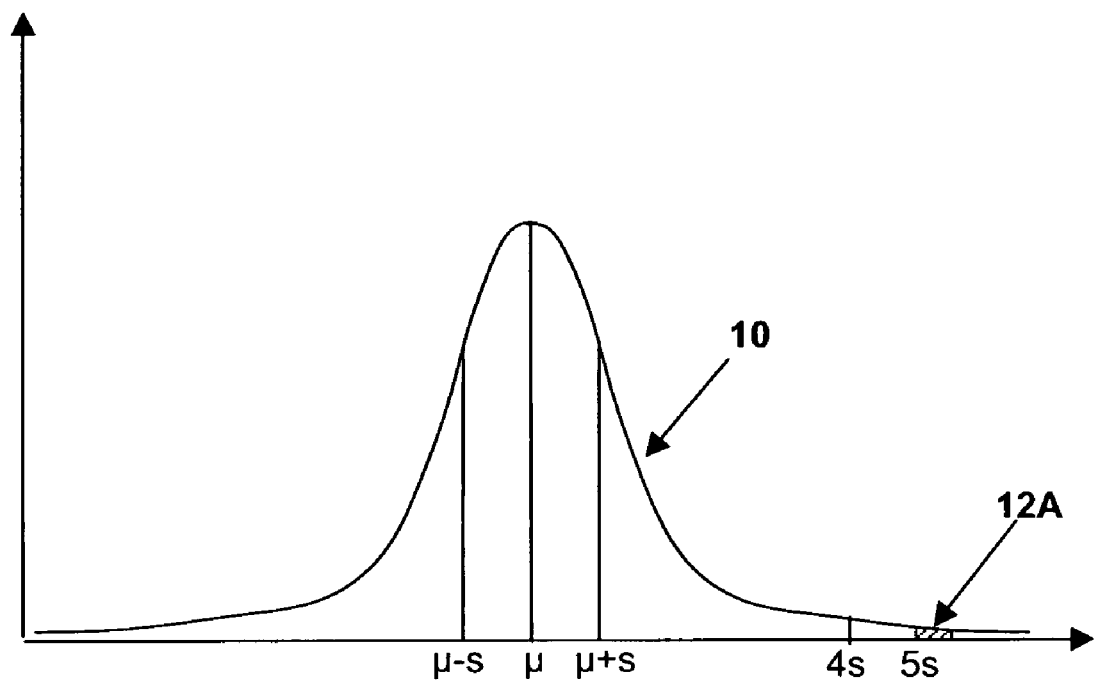
FIGS. 2A-2B and 3A-3B are graphs illustrating techniques employed in embodiments of the present invention.

Referring now to FIG. 2A, a graph illustrating the purpose and techniques of the invention is shown. A distribution 10 of operational performance values, such as the above-mentioned delay times and writeability/read stability measures, generally following a Gaussian shape extends past 5 standard deviations ($5\sigma$) on either side of a mean value. The input parameter values are generated by a similar Gaussian distribution of samples as generated around a nominal vector of cell parameter values by a Monte-Carlo algorithm.

Failure zone 12A in the graph is located past the 5σ point and is shown as a shaded area. The yield of the cell modeled by distribution 10 can be predicted from the graph, and thus the yield of the overall device. However, the accuracy near failure zone 12A is limited due to the relatively sparse distribution of samples in the tails of distribution 10. The present invention uses MIS to concentrate sampling within one or more failure zones, so that more accurate estimates of yield are produced.

Figure 2B:
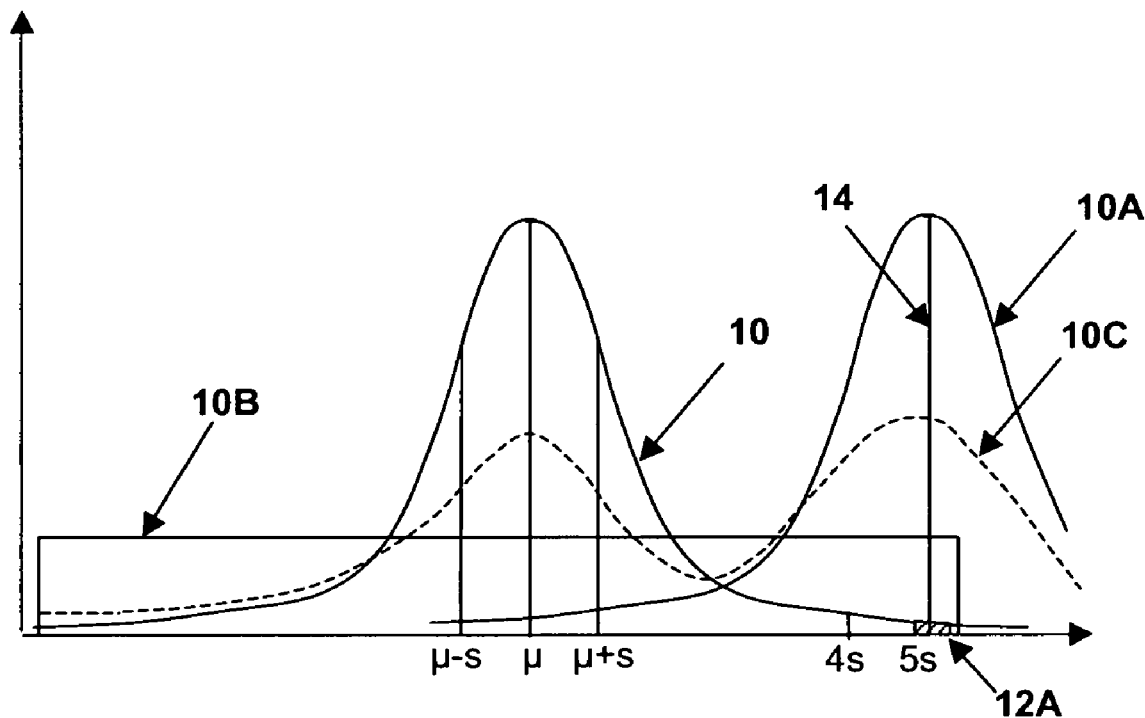

Referring now to FIG. 2B, a graph showing the operation of the present invention is shown. Once a region of interest is identified in the device and process-dependent parameter space, a mixture 10C of distributions 10, 10A and 10B is employed to improve the density of samples in zone 12A, while ensuring that gaps are not left in the distribution that might otherwise miss other failures. The mixture sampling function distribution 10C can be expressed by:

$$g_\lambda(x)=\lambda_1 p(x)+\lambda_2 U(x)+(1-\lambda_1-\lambda_2)p(x-\mu_s),$$

where $\lambda_1$ and $\lambda_2$ are coefficients used to control the mixture, which can be determined by the position of a new sampling function center $\mu_s$ 14 that is used to improve the concentration of samples around $\mu_s$. Note that $\mu_s$ is not the center of mixture sampling function distribution 10C, but rather the center of gaussian distribution 10A forming part of sampling function distribution 10C. Uniform distribution U(x) 10B is also included in the mixture, which helps in ensuring that some samples are present for all values within the interval over which uniform distribution 10B extends. The choice of coefficients, in combination with the inclusion of the uniform distribution is made so that the number of samples in the region of interest is increased, but no "dead spots" are present in the analysis.

The result of the mixture sampling function is to generate a relatively larger number of samples over zone 12A (as compared to the distribution of FIG. 2A), yielding a much more precise estimate of the impact of zone 12A on. Results show a more than 10× improvement (or greater, in proportion to the distance of zone 12A from the nominal mean μ) in convergence time for estimates of the edges of failure zone 12A, which results in a corresponding improvement in convergence of the calculation of overall device yield.

While generally the statistical analysis detailed above will be conducted independently over the operational performance variables being studied, it is possible to conduct a combined pass/fail analysis over the parameter space in which no information about the particular operational performance variables associated with each failed point is retained, but the overall desirability of a particular design can be directly observed with respect to process variations. MIS analysis can then be conducted with one or more mean-shifting distributions included to precisely predict the yield.

Figure 3A:
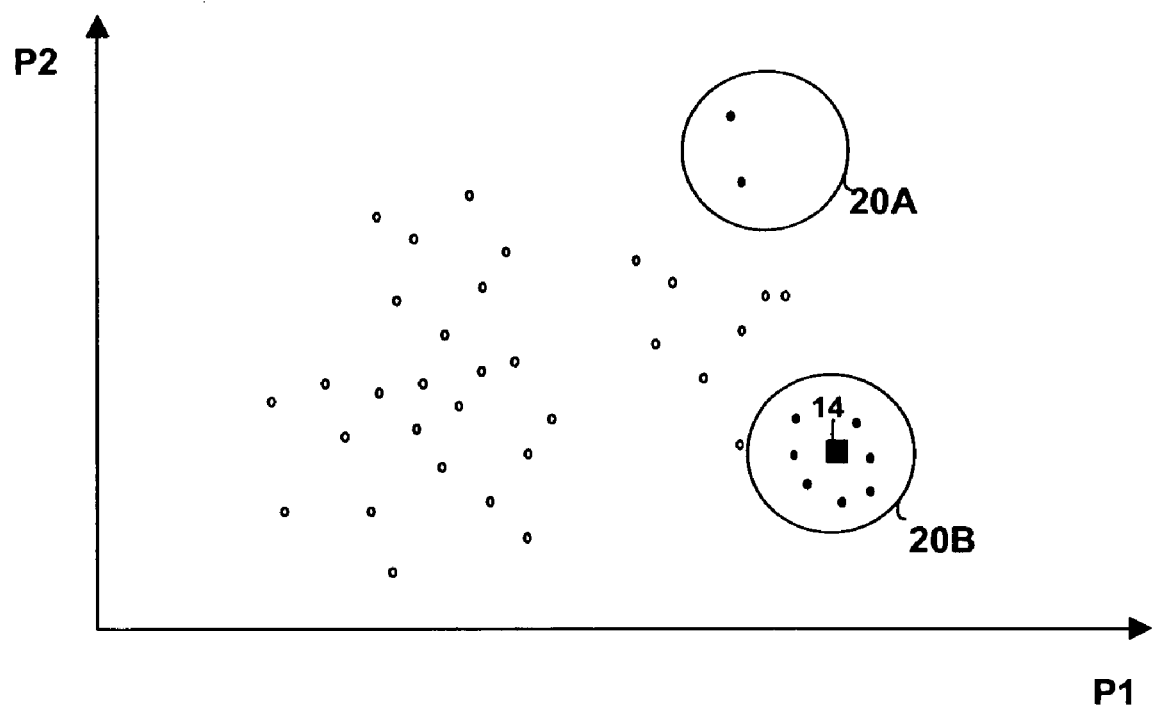

Referring now to FIG. 3A, a first technique for locating sampling function center $\mu_s$ 14, is depicted. Since memory cell operational performance variable failure regions generally will extend to the bounds of the analysis range (with respect to the parameter deviation) from the point at which the failures occur, failure regions can be ascribed to failure region boundaries beyond which the probability of failure only increases. The illustration is two-dimensional but in actual practice, a larger number of dimensions are actually being evaluated simultaneously. A number of sample points are generated by uniformly sampling the variable memory cell parameter space, corresponding to the dots shown in the Figure. Quasi-random sampling techniques can be used to improve the spread of the samples across the parameter space. In the Figure, hollow dots depict non-failing points and solid dots depict failing points. After a threshold number of failures is accumulated, which may be qualified by observing their proximity in the parameter space if multiple failure regions might be present (in order to group the failures), a particular failure region of interest 20B is identified and the vector centroid 14 of that region computed and used as new sampling function center $\mu_s$ 14 for subsequent MIS analysis. The vector centroid is computed from the vector distances of the points as the vector of average distance in each parameter space. There may be multiple failure regions for some applications of the techniques of the present invention including other failure regions such as 20A, and those regions can be ignored if not of interest, or may be further evaluated with independent MIS analysis around their centers.

The above-described technique is especially applicable to the study of memory cell designs that have a single dominant failure region of interest. However, if it is not known in advance that there will be a single dominant region, the positions of the failure samples in parameter vector space can be observed and the samples grouped into one or more groups as mentioned above. If a group is much more distant from the nominal parameter vector, then that group may be discarded as being due to a relatively unimportant failure mechanism. The technique of the present invention can be used to obtain better information about multiple failure mechanisms by the above grouping technique or discarding of groups.

A threshold number of samples can then be collected for each group to be studied and either an independent set of MIS analyses can be conducted for each group, or the above MIS sampling distribution function can be modified to follow:

$$g_\lambda(x)=\lambda_1 p(x)+\lambda_2 U(x)+\lambda_3 p(x-\mu_{s1})+(1-\lambda_1-\lambda_2-\lambda_3)p(x-\mu_{s2}),$$

where $\lambda_1$, $\lambda_2$ and $\lambda_3$ are coefficients used to control the mixture and new sampling function centers $\mu_{s1}$ $\mu_{s2}$ are used to improve the concentration of samples around two regions of interest. If more than two regions of interest are present, the above sampling function can be expanded to include other mean shifting values and their associated sampling function kernels in the above sampling function.

Figure 3B:
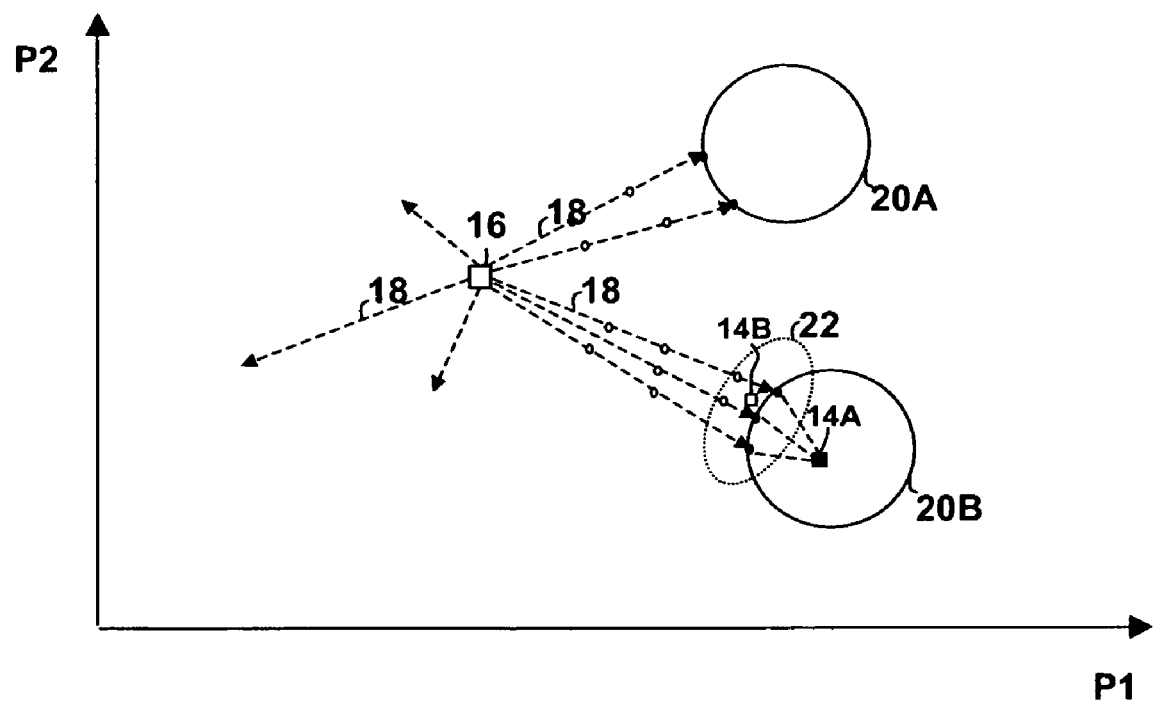

Referring now to FIG. 3B, another technique adapted for treating circuits having multiple dominant failure regions is depicted, e.g., circuits for which multiple failure mechanisms have fairly equivalent statistical significance. The technique may also be used for single failure region analysis, as well. A vector of nominal memory cell parameter values 16 is used as a starting point for random generation of a sufficient initial number of vector directions 18 along which cell failure analysis proceeds until failure points are detected. A sufficient number of vector is generated so that failure regions will not be missed by the analysis. Gaussian latin hypercube sampling can be used to ensure uniform placement of the vectors in all directions.

The analysis then proceeds away from nominal vector 16 as illustrated. The generally monotonic behavior of the circuits as the parameters vary in one direction away form the nominal ensures that failing points will only be encountered at and beyond the boundaries of the failure regions 20A, 20B. The new sampling function center $\mu_s$ 14 for subsequent MIS analysis is determined either by the mean vector 14B corresponding to the group of boundary points 22, or an estimated vector 14A is extrapolated within failure region of interest 20B from the location of the boundary points. After a first iteration, if the boundaries of failure regions 20A, 20B are not sufficiently defined, a local set of random vectors is generated to enhance the set of samples around the boundaries. After boundaries 20A, 20B are sufficiently defined $\mu_s$ 14 is chosen as described above. As in the center of gravity technique, regions of interest that are more distant from the nominal vector can be discarded as relatively unimportant failure mechanisms. The technique illustrated in FIG. 3B also provides better information about multiple failure mechanisms by locating the boundaries of the regions of interest. If the boundaries are not well defined after the above analysis has been attempted, then the entire process can be repeated with a larger set of initial random vectors.

Figure 4:
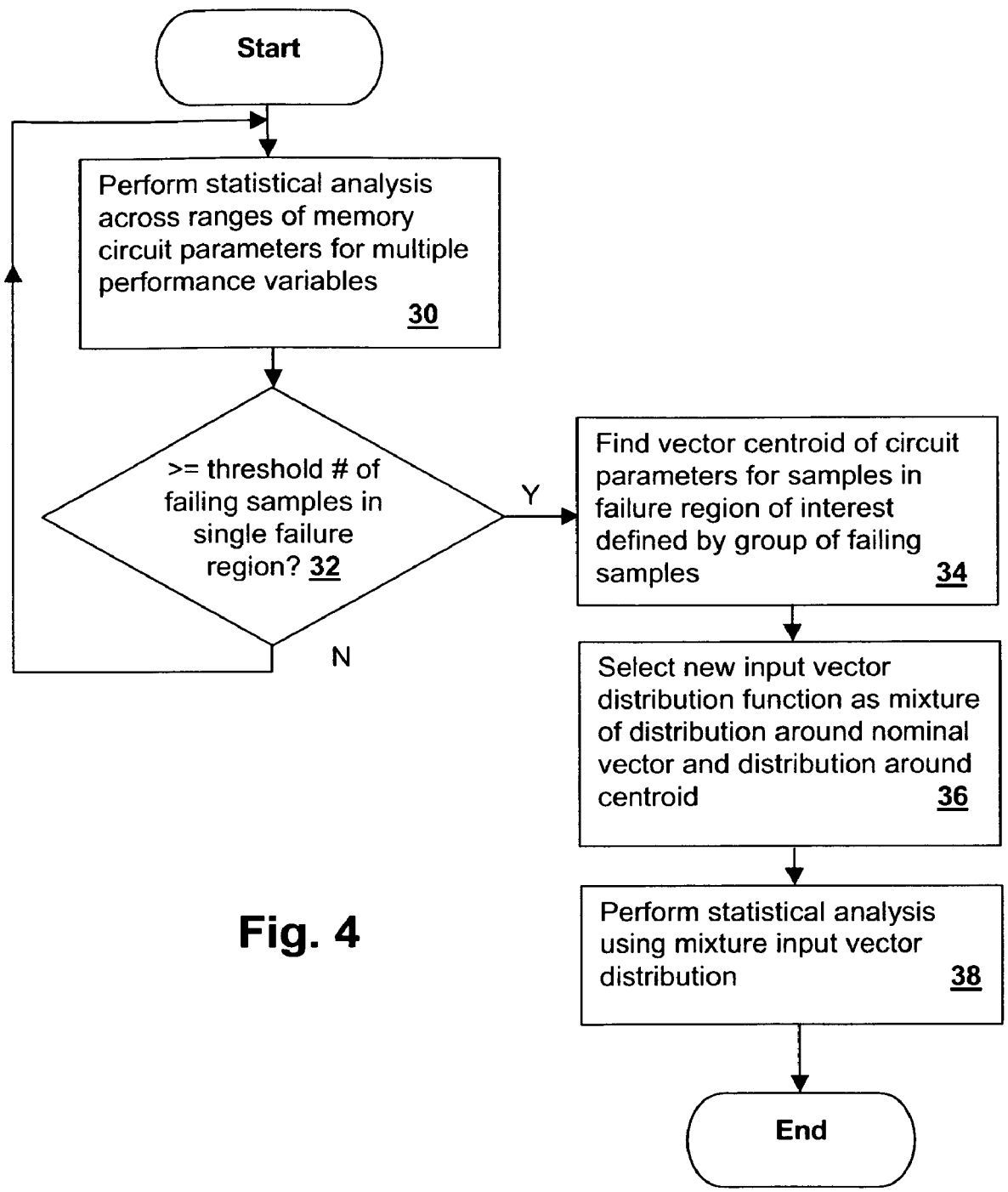
FIG. 4 is a flowchart depicting a method in accordance with an embodiment of the present invention.

Referring now to FIG. 4, a method according to an embodiment of the present invention is shown, corresponding to the centroid-locating technique described above with reference to FIG. 3A. First, a statistical analysis across ranges of memory circuit parameters is performed for multiple performance variables (step 30) and once a threshold number of failing samples is accumulated (possibly qualified as being in a single failure region if required) (step 32) the centroid of the parameters corresponding to the group of failures is determined (step 34). Finally, a new distribution of input parameter vectors is selected in conformity with the determined centroid and the nominal vector (step 36) and an MIS analysis is performed (step 38) using the new mixture distribution to gain more accurate results in the region of the failures and a faster convergence of the overall yield computation.

Figure 5:
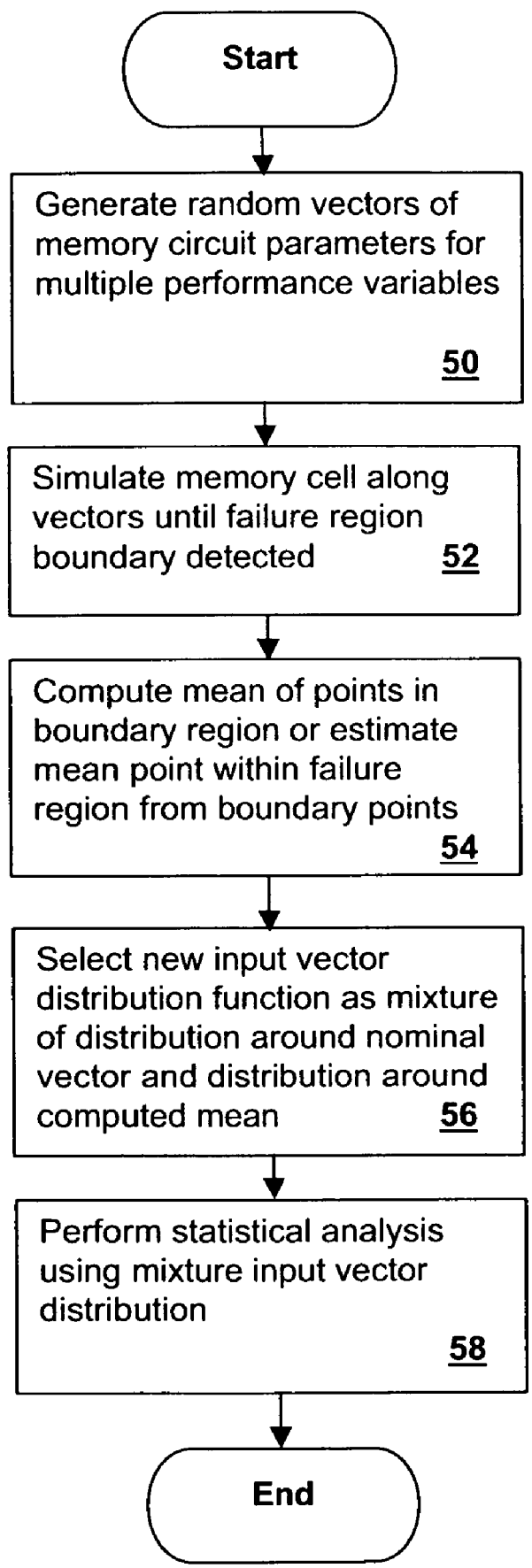
FIG. 5 is a flowchart depicting another method in accordance with another embodiment of the present invention.

Referring now to FIG. 5, another method according to an embodiment of the present invention is shown, corresponding to the random vector technique described above with reference to FIG. 3B. First, random vector directions are generated around the nominal value of the memory circuit parameters (step 50). The memory cell is simulated along the vectors until a failure is detected, corresponding to a failure region boundary (step 52). Then, a mean point is computed from multiple failure region boundary points or a point is estimated within the failure region from the boundary points (step 54). An MIS distribution function is then selected (step 56) as a mixture of a distribution around the nominal parameter values and the mean point computed in step 54 (along with the uniform distribution), and an MIS analysis is performed (step 58) using the new mixture distribution to gain more accurate results in the region of the failures and a faster convergence of the overall yield computation.

Figure 6:
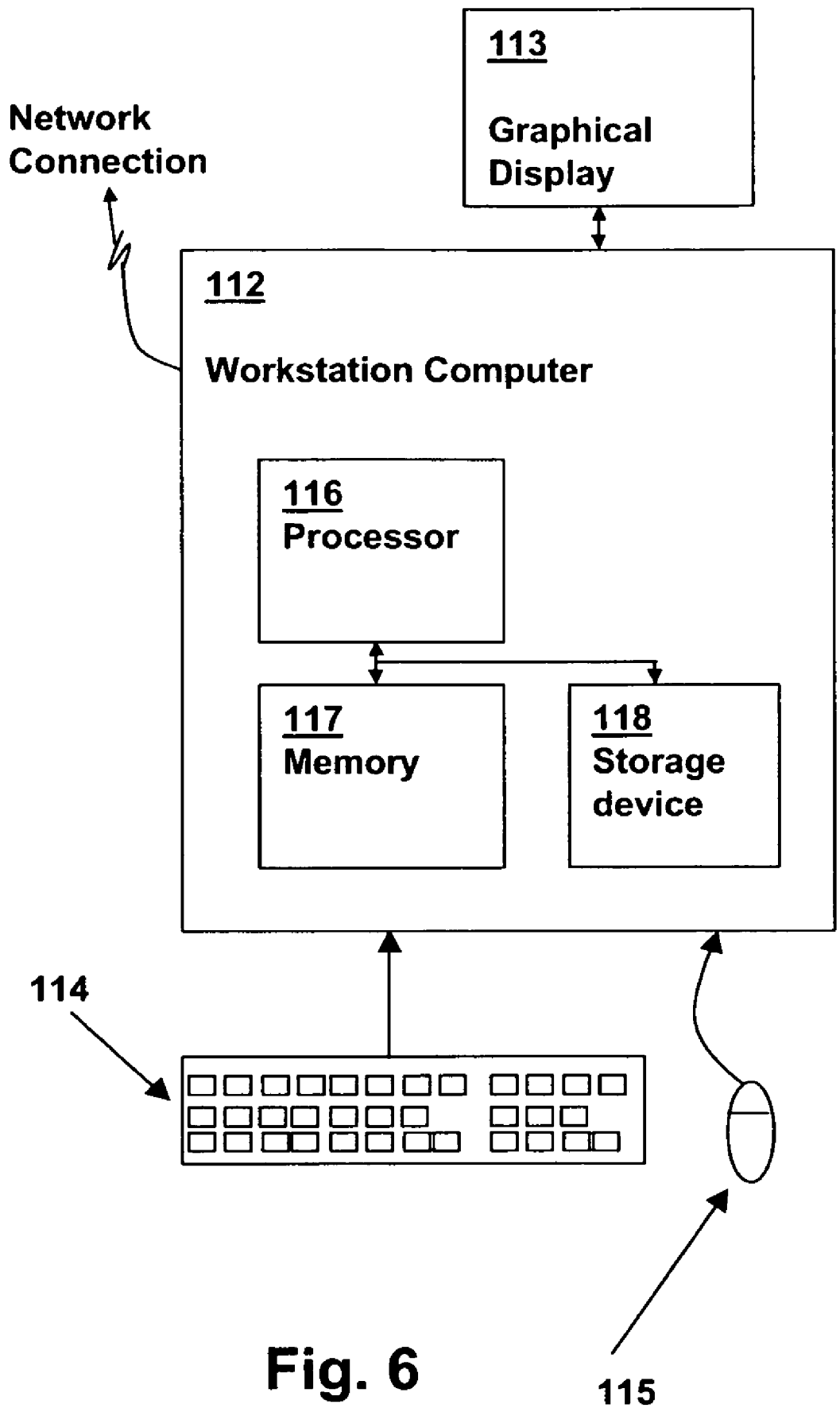
FIG. 6 is a pictorial diagram depicting a workstation computer system in which the methods of FIGS. 4-5 can be practiced by executing program instructions of a computer program product in accordance with an embodiment of the present invention.

Referring now to FIG. 6, a workstation computer system, in which the above-described methods according to an embodiment of the present invention are performed, is depicted. A workstation computer 112, having a processor 116 coupled to a memory 117, for executing program instructions from memory 117, wherein the program instructions include program instructions for executing one or more methods in accordance with an embodiment of the present invention, such as the methods described above with respect to FIGS. 4 and 5.

Workstation computer 112 is coupled to a graphical display 113 for displaying program output such as simulation results and circuit layout structure input, design and verification programs implementing embodiments of the present invention. Workstation computer 112 is further coupled to input devices such as a mouse 115 and a keyboard 114 for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 112. A computer program product for carrying out the method of the present invention may be embodied in a file on an internal storage device 118 of computer 112, or stored on a transportable medium such as a compact disc or flash memory storage device.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A computer-performed method for efficiently analyzing a failure rate of a cell in an array of cells, comprising:
   identifying a failure region of interest corresponding to values of circuit parameters of said cell from a result of a statistical performance analysis, wherein the failure region of interest is determined according to first samples of a performance variable;
   selecting a sampling function center in conformity with a position of said failure region of interest to increase a frequency of samples of said performance variable in or near said region of interest;
   performing a mixture importance analysis within a computer system in conformity with said sampling function center to determine effects of variation of said cell circuit parameters within and near said failure region of interest on said failure rate, wherein the mixture importance analysis computes second samples from a mixture distribution obtained by summing multiple differing distributions of said performance variable according to weighting coefficients associated with each of said multiple distributions, whereby said second samples are generated according to a mixture of said multiple distributions; and
   storing a result of said mixture importance analysis within a memory of said computer system.

2. The method of claim 1, wherein said identifying is performed by:
   uniformly sampling a cell circuit parameter space to select input vectors for said performance analysis; and
   accumulating at least a threshold number of failure points to define said failure region of interest.

3. The method of claim 2, wherein said selecting is performed by computing a center of gravity of said failure region of interest from input vectors of said accumulated failure points.

4. The method of claim 1, wherein said identifying is performed by:
   varying said cell circuit parameters from a nominal-valued vector of said cell circuit parameters until a failure point is detected over a number of randomly generated cell circuit parameter vector directions; and
   finding a group of failure points resulting from said varying and closest to said nominal-valued vector to locate a boundary of said failure region of interest, whereby said failure region of interest is identified.

5. The method of claim 4, wherein said selecting is performed by computing a mean input vector across said group of failure points, whereby said new sampling center is selected around said boundary of said failure region of interest.

6. The method of claim 4, wherein said selecting is performed by estimating a point within said failure region of interest from input vectors corresponding to points within said group of failure points, whereby said new sampling center is selected within said failure region of interest.

7. The method of claim 6, wherein said estimating estimates the center of said failure region of interest.

8. The method of claim 1, wherein said statistical performance analysis and mixture importance analysis are performed to determine each of a plurality of performance variables including writeability, read stability, write delay and read delay times.

9. The method of claim 1, wherein said multiple distributions comprise at least three distributions, and wherein said performing performs said mixture importance analysis in conformity with said at least three distributions.

* * * * *